United States Patent
Baba et al.

(10) Patent No.: US 9,698,217 B1
(45) Date of Patent: Jul. 4, 2017

(54) SEMICONDUCTOR DEVICE

(71) Applicant: Sanken Electric Co., Ltd., Saitama (JP)

(72) Inventors: Ryohei Baba, Saitama (JP); Toru Yoshie, Saitama (JP); Tomonori Hotate, Saitama (JP); Yuki Tanaka, Saitama (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 15/188,513

(22) Filed: Jun. 21, 2016

(30) Foreign Application Priority Data

Jun. 15, 2016 (JP) .................................. 2016-118989

(51) Int. Cl.
| | |
|---|---|
| H01L 29/06 | (2006.01) |
| H01L 21/04 | (2006.01) |
| H01L 29/16 | (2006.01) |
| H01L 29/78 | (2006.01) |
| H01L 29/10 | (2006.01) |
| H01L 29/66 | (2006.01) |

(52) U.S. Cl.
CPC ........ H01L 29/063 (2013.01); H01L 21/0465 (2013.01); H01L 29/1095 (2013.01); H01L 29/1608 (2013.01); H01L 29/66068 (2013.01); H01L 29/7813 (2013.01)

(58) Field of Classification Search
CPC ....... H01L 29/06; H01L 29/063; H01L 29/10; H01L 29/1095; H01L 29/16; H01L 29/1608; H01L 29/66; H01L 29/66068; H01L 29/78; H01L 29/7813; H01L 21/04; H01L 21/0465

USPC .......................................................... 257/77
See application file for complete search history.

(56) References Cited

U.S. PATENT DOCUMENTS

2008/0283913 A1* 11/2008 Shibata ............... H01L 29/0634
257/341

FOREIGN PATENT DOCUMENTS

| JP | 2009-117593 A | 5/2009 |
|---|---|---|
| JP | 2013-069940 A | 4/2013 |

* cited by examiner

*Primary Examiner* — Monica D Harrison
(74) *Attorney, Agent, or Firm* — Hawaii Patent Services; Nathaniel K. Fedde; Kenton N. Fedde (57) ABSTRACT

A semiconductor device of trench gate type is provided that has achieved both large on-current and high off-state breakdown voltage. Around trench T and between it and electric field relaxation p-layer 16, low resistance n-layer 17 is provided. Low resistance n-layer 17 is formed deeper than trench T, and shallower than electric field relaxation p-layer 16, being connected to n⁻-layer (drift layer) 12 just thereunder, and thus low resistance n-layer 17 and n⁻-layer 12 are integrated to form a drift layer. Although low resistance n-layer 17 is n-type as is n⁻-layer 12, donor concentration thereof is set higher than that of n⁻-layer 12, thereby low resistance n-layer 17 having a resistivity lower than that of n⁻-layer 12. This low resistance n-layer 17 is provided in on-current path (between electric field relaxation p-layer 16 and trench T), whereby low resistance n-layer 17 can lower the resistance to on-current.

2 Claims, 10 Drawing Sheets

SEMICONDUCTOR DEVICE

INCORPORATION BY REFERENCE

This application is based on and claims the benefit of priority from Japanese Patent Application No. 2016-118989 filed on Jun. 15, 2016, the entire contents of which are hereby incorporated by reference.

BACKGROUND

The present invention relates to a structure of a semiconductor device in which a gate electrode is provided within a trench.

For switching operation at a large current, power MOS-FETs or IGBTs are used, and in order to provide a large operating current, an element of trench gate type in which a gate electrode is provided within a trench is particularly preferably used. In addition, conventionally, as the material for a semiconductor substrate constituting such element, Si has been in a widespread use, but in recent years, silicon carbide (SiC), which has a band gap larger than Si and can constitute an MOSFET in the same manner as Si, has been used. In this case, as compared to the case where Si is used, operation at a high voltage and a large current, is allowed, however, the gate oxide film within the trench becomes easy to be broken down with a high voltage, and therefore, a structure that can raise the breakdown voltage has been used.

Figure 6:
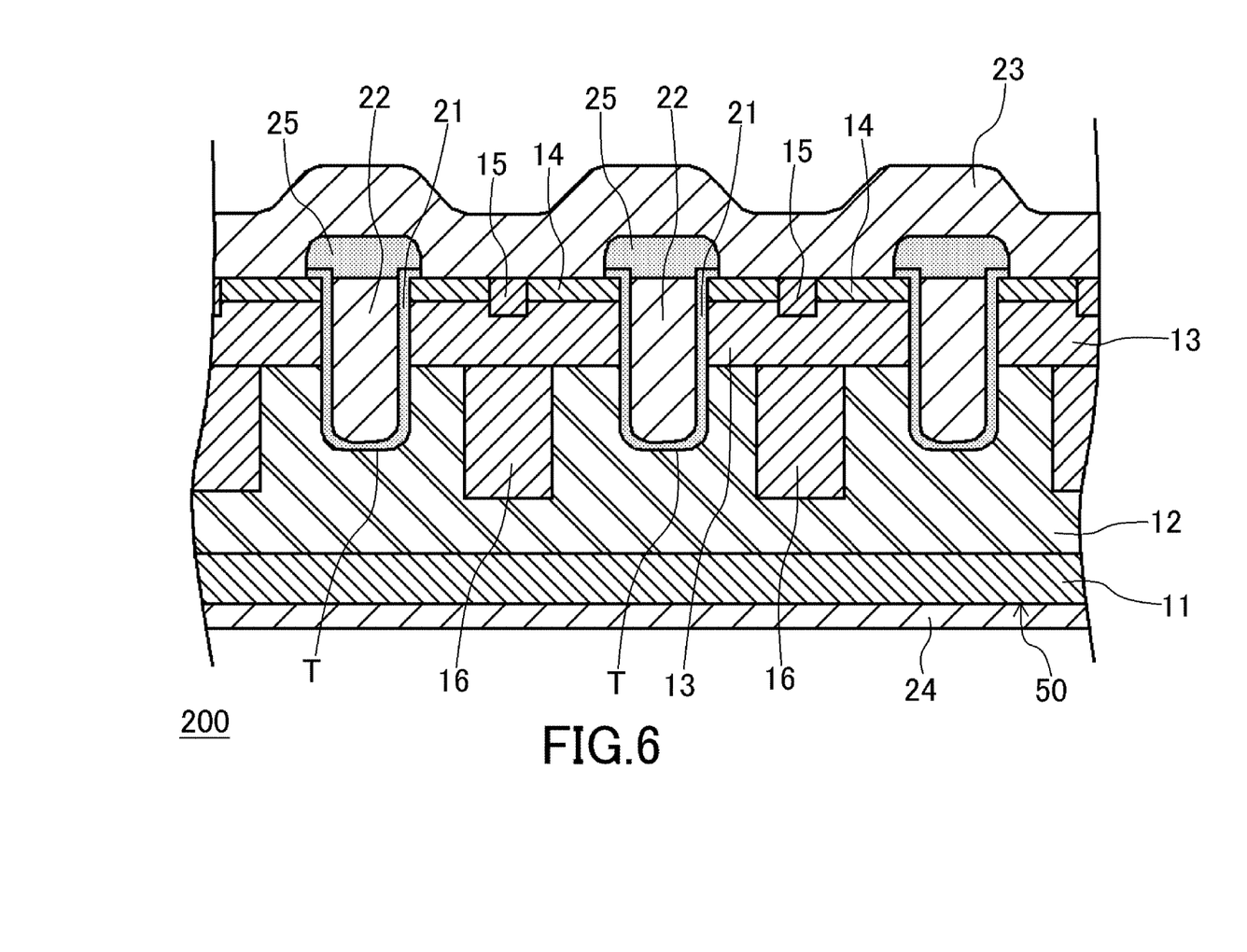
FIG. 6 is a sectional view of a conventional semiconductor device of trench gate type.

The structure of a power MOSFET of trench gate type that uses SiC is disclosed in, for example, Patent Documents 1 and 2. FIG. 6 is a sectional view showing a structure of such semiconductor device (a power MOSFET) 200. Here, with a semiconductor substrate 50, which is formed of SiC, a plurality of trenches T (three are shown within the range of the figure) are formed in parallel in a direction perpendicular to the paper sheet surface. Within the semiconductor substrate 50, an $n^+$ layer (a drain layer) 11 of n type (a first conductivity type), in which a donor has been doped at a high concentration; an $n^-$ layer (a drift layer: a first semiconductor region) 12, in which a donor has been doped at a low concentration; a p layer (a body layer: a second semiconductor layer region) 13 of p type (a second conductivity type) are formed sequentially from the bottom side. As a surface layer of the semiconductor substrate 50 that is on the p layer 13, an $n^+$ layer (a source region: a third semiconductor region) 14 is formed. The trench T is formed from the surface of the semiconductor substrate 50 such that it reaches the $n^-$ layer 12 from the $n^+$ layer 14, and within the trench T, a gate electrode (a control electrode) 22 is formed through a gate oxide film 21. In addition, in the surface of the semiconductor substrate 50, a $p^+$ layer 15, in which an acceptor has been doped at a high concentration is locally formed, and this $p^+$ layer 15 is connected to the p layer 13 thereunder.

On the surface side of the semiconductor substrate 50 (on the top side in FIG. 6), a source electrode 23 is formed so as to be in contact with the $n^+$ layer 14 and the $p^+$ layer 15. Here, on the top side of the trench T, the gate electrode 22 is insulated from the source electrode 23 by a interlayer insulating layer 25. In addition, on the rear surface side of the semiconductor layer 50 (the bottom side in FIG. 6), a drain electrode 24 is formed so as to be in contact with the entire face of the $n^+$ layer 11. With this structure, at the time of operation, the $n^+$ layer 14 and the p layer 13 are provided with a potential of the source electrode 23 (a source potential: generally a ground potential), while the $n^+$ layer 11 is provided with a potential of the drain electrode 24 (a drain potential: generally a positive high potential). To the gate electrode 22, a potential that is close to the source potential and is according to the on-off control is applied. In on state, in the p layer 13 opposed to the gate electrode (in the p layer 13 at a side face of the trench T), a channel is induced, and therefore, across the source electrode 23 and the drain electrode 24, a current flows along a side wall of the trench T within the p layer 13, and in a vertical direction within the $n^-$ layer 12. On the other hand, in off state, a depletion region spreads from the circumference of the trench T and the interface (the pn junction) between the p layer 13 and the $n^-$ layer 12 towards the $n^-$ layer 12. The electric field in off state is applied to the gate oxide film 21 and to within such depletion region, and thus by expanding the depletion region appropriately, the intensity of such electric field is reduced, whereby the breakdown voltage can be enhanced. Thus, the donor concentration within the $n^-$ layer 12 is set at a low value.

However, with this structure, even in the case where the depletion region on the side of the $n^-$ layer 12 has been expanded, in off state, the intensity of the electric field especially within the gate oxide film 21 in the bottom end part of the trench T tends to be increased, thereby the breakdown voltage for such semiconductor device 200 being limited in some cases. Here, in the structure in FIG. 6, in a place separate from the trench T on the lateral side of the trench T, an electric field relaxation p-layer (a fourth semiconductor region) 16 is locally provided more deeply than the trench T, being connected to the p layer 13 on the upper side thereof. In off state, also around this electric field relaxation p-layer 16, a depletion region is formed. Particularly, since the electric field relaxation p-layer 16 is formed deeper than the trench T, the depletion region on the side of the electric field relaxation p-layer 16 is formed to a greater depth on the lateral side of the trench T. The depletion region on the side of the bottom part of the trench T is connected to such deeper depletion region on the side of the electric field relaxation p-layer 16, and therefore in the portion where a connection is produced, the breadth of the depletion region is increased, whereby the intensity of the electric field that is applied to the gate oxide film 21 in the bottom end part of the trench T can be decreased. In this way, by forming the electric field relaxation p-layer 16 locally deeply, the intensity of the electric field that is applied to the gate oxide film 21 in the bottom end part of the trench T in off state can be decreased, whereby the breakdown voltage for this semiconductor device 200 can be improved.

Patent Document 1: Japanese Unexamined Patent Application Publication No. 2009-117593

Patent Document 2: Japanese Unexamined Patent Application Publication No. 2013-69940

In the above-described structure, in on state, the current flows along the side wall of the trench T within the p layer 13, and therefore, within the $n^-$ layer 12, most of the current will not flow in the region just under the trench T, and will flow in a vertical direction in the region other than that just under the trench T (i.e., the region around the trench T). Here, as described above, in the region where the trench T is not formed when viewed from the top face, the electric field relaxation p-layer 16 exists, and therefore, the path for a current along a vertical direction in the $n^-$ layer 12 is narrowed down by the electric field relaxation p-layer 16, thereby it having been difficult to decrease the resistance to the current within the $n^-$ layer 12. Thereby, the current that can be caused to flow in on state (the on-current) has been limited.

Consequently, a semiconductor device of trench gate type that has achieved both large on-current and high breakdown voltage in off state has been demanded.

The present invention has been made in view of such problems, and is intended to provide a semiconductor device with which the above-mentioned problems can be solved.

SUMMARY

In order to solve the problems as described above, the present invention provides the following scheme:

According to an aspect of the present invention, there is provided a semiconductor device, including a first semiconductor region of a first conductivity type; a second semiconductor region of a second conductivity type opposite to the first conductivity type that has been formed above the first semiconductor region; a third semiconductor region of the first conductivity type that has been formed on the second semiconductor region; a trench that is formed from a surface of the third semiconductor region to a depth penetrating through the third semiconductor region and the second semiconductor region; a control electrode that has been formed in the trench; a fourth semiconductor region of the second conductivity type that is in contact with the second semiconductor region between the trenches that are adjacent to each other, and is formed deeper than the trench, being separated from the trench, a source electrode that is electrically connected to the second semiconductor region and the third semiconductor region, a drain electrode that is electrically connected to the first semiconductor region, and a fifth semiconductor region of the first conductivity type that is between the first semiconductor region and the second semiconductor region, being formed between the trench and the fourth semiconductor region, and being provided with a carrier concentration higher than that of the first semiconductor region.

According to another aspect of the present invention, there is provided a semiconductor device, in which the fifth semiconductor region is lower than the second semiconductor region in carrier concentration.

According to another aspect of the present invention, there is provided a semiconductor device, in which a bottom part of the fifth semiconductor region covers a bottom part of the trench, and is located between the bottom part of the trench and a bottom part of the fourth semiconductor region in a vertical direction.

According to another aspect of the present invention, there is provided a semiconductor device, in which a bottom part of the fifth semiconductor region has a flat part.

According to another aspect of the present invention, there is provided a semiconductor device, in which the fifth semiconductor region is an epitaxial layer, the carrier concentration thereof being substantially constant in a depthwise direction.

According to another aspect of the present invention, there is provided a semiconductor device, in which a bottom part of the fourth semiconductor region has a protrusion part that is protruded towards the trench in a horizontal direction.

According to another aspect of the present invention, there is provided a semiconductor device, in which a top face of the protrusion part is in contact with a bottom part of the fifth semiconductor region.

The present invention is schemed as described above, whereby a semiconductor device of trench gate type that has achieved both large on-current and high breakdown voltage in off state can be obtained.

DETAILED DESCRIPTION

Figure 1:
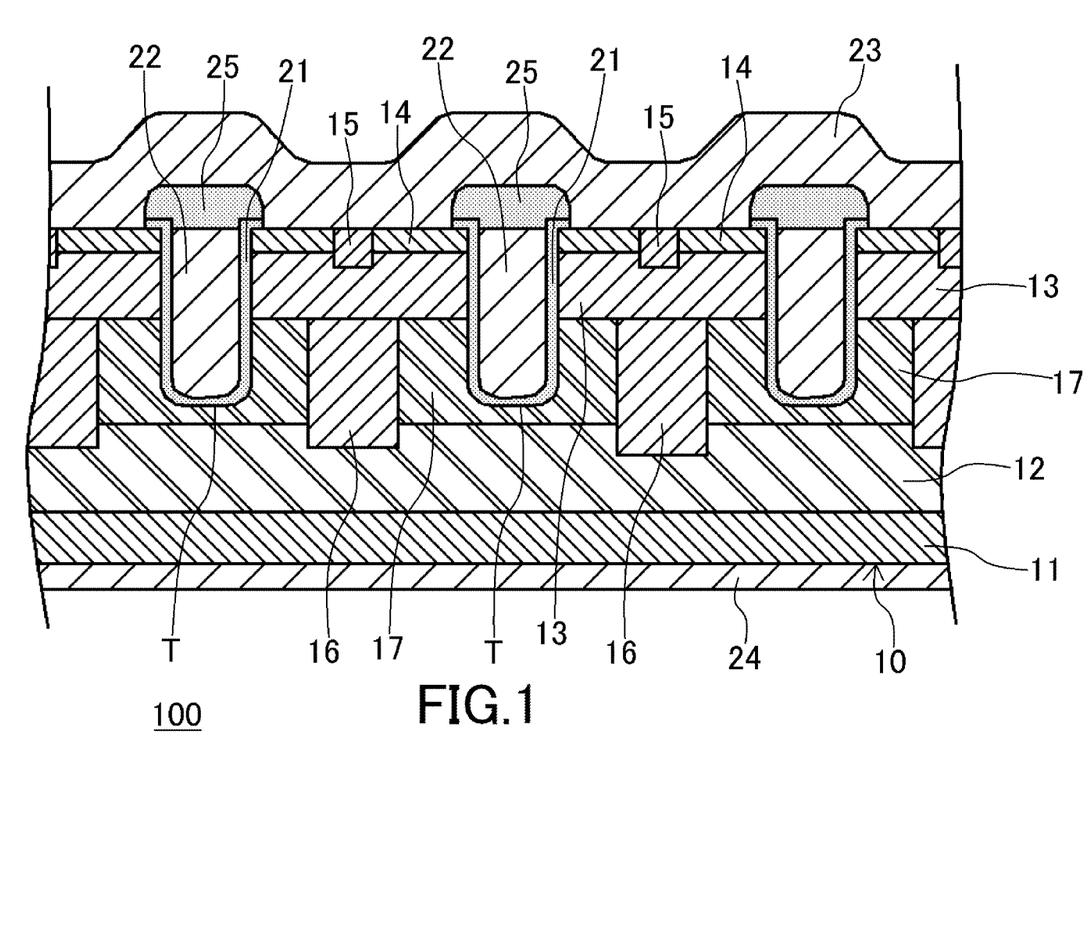
FIG. 1 is a sectional view of a semiconductor device according to an embodiment of the present invention.

Hereinbelow, a semiconductor device according to an embodiment of the present invention will be explained. FIG. 1 is a sectional view of such semiconductor device 100. This semiconductor device 100 is a power MOSFET of trench gate type as is the above-described semiconductor device 200, and in the same manner as described above, a semiconductor substrate 10 in which an $n^+$ layer (a drain layer) 11; an $n^-$ layer (a drift layer: a first semiconductor region) 12; a p layer (a body layer: a second semiconductor region) 13; an $n^+$ layer (a source region: a third semiconductor region) 14; and a $p^+$ layer 15 are formed, and that is formed of SiC is used. In addition, in the same manner as described above, a trench T is formed in this semiconductor substrate 10; a gate oxide film 21, a gate electrode (a control electrode) 22, a source electrode (a first main electrode) 23, and a drain electrode (a second main electrode) 24 are provided in the same manner as described above; and on the top side of the semiconductor substrate 10, the gate electrode 22 and the source electrode 23 are insulated by the interlayer insulating layer 25. Turning on/off of a current flowing across the source electrode 23 and the drain electrode 24 is controlled by a current applied to the gate electrode 22, and this current flows in a vertical direction in the region providing a side wall of the trench T in the p layer 13, and in the $n^-$ layer (the drift layer) 12. In addition, as described above, in order to release the electric field concentration in the gate oxide film 21, an electric field relaxation p-layer (a fourth semiconductor region) 16 is provided between adjacent trenches T, being separated from the trenches T.

However, here, around the trench T and between the trench T and the electric field relaxation p-layer 16, a low resistance n-layer (a fifth semiconductor region) 17 is provided. The low resistance n-layer 17 is formed deeper than the trench T, and shallower than the electric field relaxation p-layer 16, being connected to the p⁻ layer (the drift layer) 12 just thereunder, and thus the low resistance n-layer 17 and the n⁻ layer 12 are integrated to form a drift layer. Here, as described above, the donor concentration (the carrier concentration) of the n⁻ layer 12 is set at a low value in consideration of the breakdown voltage in off state, thereby the resistivity thereof being high. Contrarily to this, although the low resistance n-layer 17 is of n type as is the n⁻ layer 12, the donor concentration thereof is set at a value higher than that of the n⁻ layer 12, thereby the low resistance n-layer 17 having a resistivity lower than that of the n⁻ layer 12. This low resistance n-layer 17 is provided in the path of a current in on state (between the electric field relaxation p-layer 16 and the trench T), whereby the low resistance n-layer 17 can lower the resistance to the current in on state.

On the other hand, in the case where the low resistance n-layer 17 is provided only in the vicinity of the trench T, in off state, the entire low resistance n-layer 17 is depleted, and the n⁻ layer 12 thereunder is also depleted. Therefore, this depletion region is connected to the depletion region around the electric field relaxation p-layer 16, and particularly since the electric field relaxation p-layer 16 is formed deeper than the trench T, the depletion region in such deeper portion is connected to the depletion region around the bottom part of the trench T, as with the above-described semiconductor device 200. Therefore, the effect that the electric field relaxation p-layer 16 can have on the intensity of the electric field within the gate oxide film 21 in the bottom end part of the trench T can be maintained. In other words, the effect of improvement of the breakdown voltage in off state by the electric field relaxation p-layer 16 can be obtained.

Figure 2:
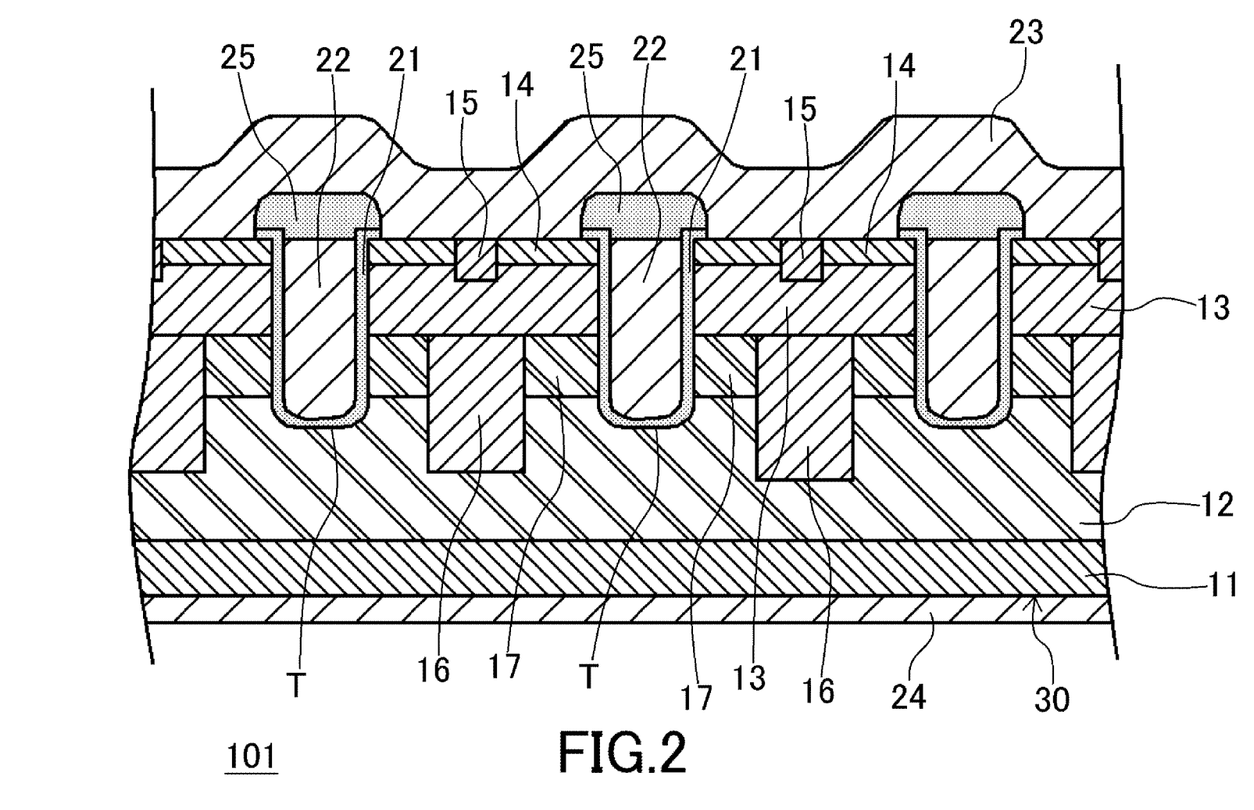
FIG. 2 is a sectional view of a variation of the semiconductor device according to the embodiment of the present invention.

In addition, in the semiconductor device 100 in FIG. 1, the low resistance n-layer 17 was formed deeper than the trench T, the bottom part of the trench T was surrounded by the low resistance n-layer 17. However, by making the low resistance n-layer 17 shallower than the trench T, a structure in which the bottom part of the trench T is not in contact with the low resistance n-layer 17, and is in contact only with the side face of the trench T may be provided. FIG. 2 is a sectional view showing a structure of a semiconductor device 101 in which a semiconductor substrate 30 having such a configuration is used. With this semiconductor substrate 30, since the low resistance n-layer 17 is thinner in a vertical direction (the direction in which a current flows), the effect of reducing the resistance in on state is low as compared to that with the semiconductor device 100 in FIG. 1, however, when compared to that with the conventional semiconductor device 200, the effect of reducing the resistance in on state is great. On the other hand, with the structure in FIG. 2, between the bottom part of the trench T and the electric field relaxation p-layer 16, there exists only the n⁻ layer 12, and in this point, the structure in FIG. 2 is the same as that of the conventional semiconductor device 200, and thus the effect of electric field relaxation within the gate oxide film 21 is greater than that of the semiconductor device 100 in FIG. 1.

Figure 3:
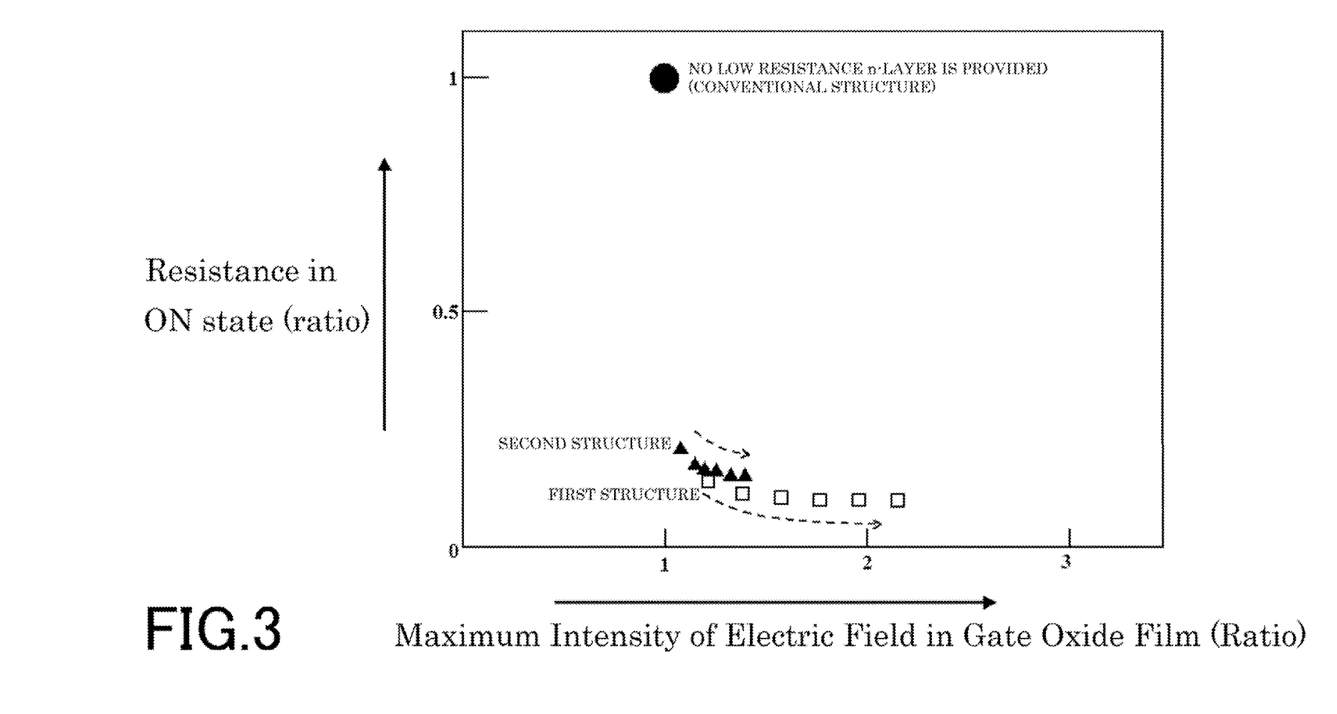
FIG. 3 gives a calculated result of the relationship between the resistance in on state and the maximum intensity of the electric field within the gate oxide film for a semiconductor device according to the embodiment of the present invention and the conventional semiconductor device.

FIG. 3 gives a calculated result of the relationship between the maximum intensity of the electric field within the gate oxide film 21 and the resistance in on state by simulation, using the conventional semiconductor device 200 with which no low resistance n-layer 17 is provided, the semiconductor device 100 (the first structure) with which the low resistance n-layer 17 is deeply formed, and the semiconductor device 101 (the second structure) with which the low resistance n-layer 17 is shallowly formed. Here, the values for either of the first structure and the second structure are given in ratio by referring to the values for the conventional semiconductor device 200, in which no low resistance n-layer 17 is provided. For the first structure and the second structure, the donor concentration in the low resistance n-layer 17 was changed in six steps in the range exceeding the donor concentration of the n⁻ layer 12, and the donor concentration is increased along the direction of the arrow. With either of the first structure and the second structure, the place where an electric field having a maximum intensity is generated within the gate oxide film 21 was the bottom end part of the trench T.

On the basis of this result, it can be that, with the first structure and the second structure, the resistance in on state can be greatly reduced down to under one fourth. On the other hand, although, with the first structure and the second structure, the intensity of the electric field within the gate oxide film 21 was increased, the amount of the increase was small. Particularly, the dependency of the resistance in on state upon the donor concentration was low, and at any donor concentration, the on-state resistance was greatly reduced. Therefore, if the donor concentration of the low resistance n-layer is set at a lower value in the range shown in FIG. 3, the rise of the maximum intensity of the electric field within the gate oxide film 21 is held to a small value (for example, 20% or under), while the resistance in on state can be greatly reduced.

Specifically, for example, the donor concentration of the p⁻ layer (the drift layer: the first semiconductor region) 12 can be in the range of $5 \times 10^{15}$ to $5 \times 10^{16}$ cm⁻³, and the acceptor concentration of the p layer (the body layer: the second semiconductor region) 13 can be $5 \times 10^{16}$ to $5 \times 10^{18}$ cm⁻³. In addition, the acceptor concentration of the electric field relaxation p-layer (the fourth semiconductor region) 16 can be $1 \times 10^{17}$ to $1 \times 10^{19}$ cm⁻³. In this case, the donor concentration of the low resistance n-layer (the fifth semiconductor region) 17 can be made higher than that of the n⁻ layer 12, and in the range of $1 \times 10^{16}$ to $1 \times 10^{17}$ cm⁻³. By making the donor concentration of the low resistance n-layer (the fifth semiconductor region) 17 lower than that of the p layer 13, the depletion region in off state is spread towards the low resistance n-layer 17, thereby the effect of electric field relaxation being enhanced.

In addition, since the increase of the maximum intensity of the electric field within the gate oxide film 21 in the first structure and the second structure is thus slight, the reduction in breakdown voltage due to such increase can be suppressed by taking such a measure as locally thickening the gate oxide film 21 in the bottom part of the trench T. Further, even if such a measure is taken, the resistance in on state will not be adversely affected, being maintained at a low value.

The method of manufacturing the above-described semiconductor device 100 will be explained. FIG. 4A to FIG. 4D are process sectional views showing a part of the processes for the method of manufacturing the same. Here, only the characteristic processes will be explained, and explanation of the other processes will be omitted, since they are the same as those for the manufacturing method for the conventional semiconductor device 200.

Figure 4A:
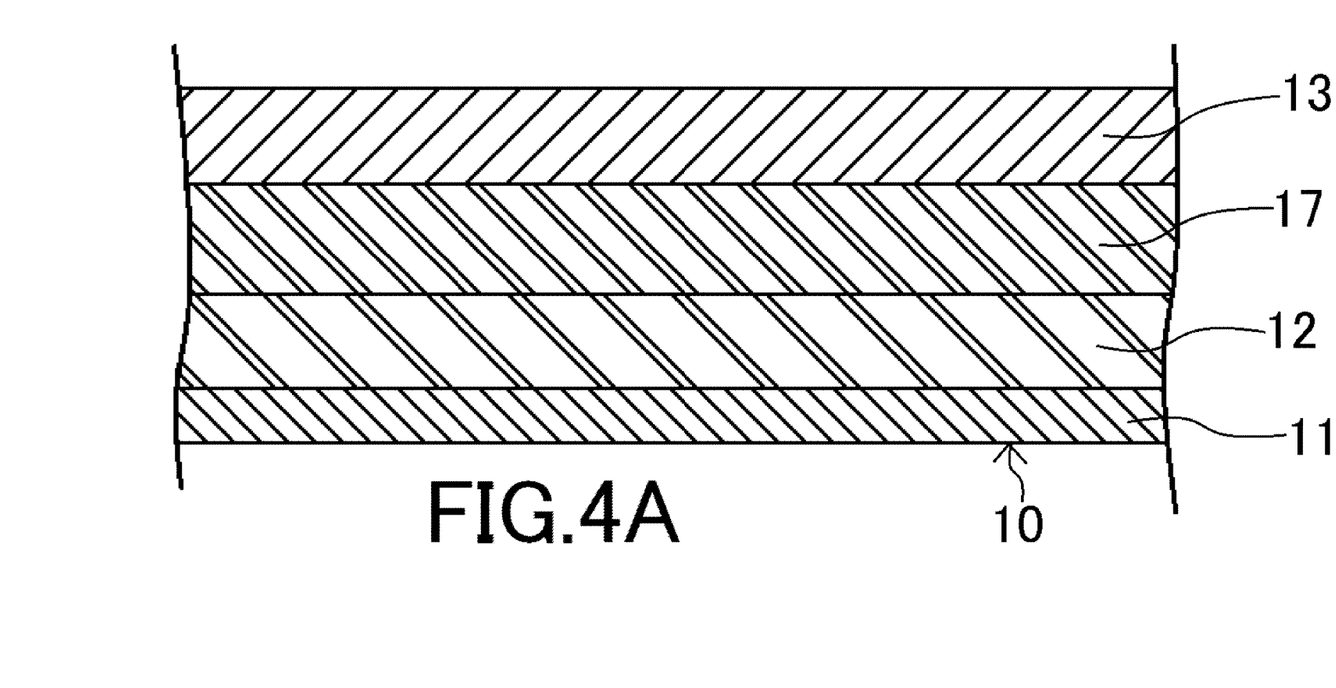
FIG. 4A is a process sectional view (a first of a set of figures) showing a part of the manufacturing processes for a semiconductor device according to the embodiment of the present invention.

First, as shown in FIG. 4A, the semiconductor substrate 10 in which the n⁺ layer (the drain layer) 11, the n⁻ layer (the drift layer) 12, the low resistance n-layer 17, and the p layer 13 are formed sequentially from the bottom side is prepared. Specifically, each of these layers can be formed by epitaxial growth or ion implantation. In this case, on the substrate (a wafer) the whole of which is comprised of the n⁻ layer 12, the n⁺ layer (the drain layer) 11, the low resistance n-layer 17, and the p layer 13 can be formed. In the case where the low resistance n-layer 17 is to be formed as an epitaxial layer (a layer that is formed by epitaxial growth), the donor concentration thereof can be made uniform (substantially constant in the depthwise direction). In addition, the bottom part of the low resistance n-layer 17 (the interface between the low resistance n-layer 17 and the n⁻ layer 12) is made flat. In the case where ion implantation is used to form the respective layers, it is necessary to perform a heat treatment for activating the donor and the acceptor after the ion implantation, however, at this stage, only the ion implantation may be performed, and the heat treatment may be conducted in a batch after performing another ion implantation process that will be described later.

Figure 4B:
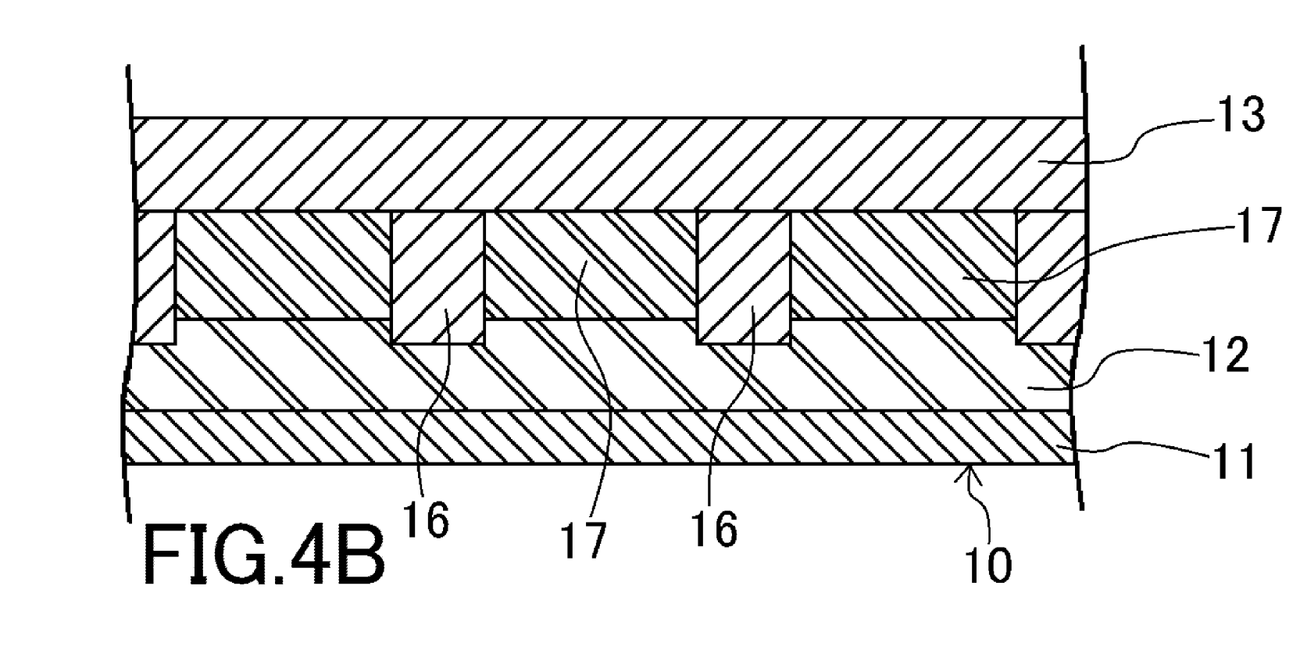
FIG. 4B is a process sectional view (a second of a set of figures) showing a part of the manufacturing processes for a semiconductor device according to the embodiment of the present invention.

Next, as shown in FIG. 4B, by local ion implantation of the acceptor, the electric field relaxation p-layer 16 is formed. In this ion implantation, a photoresist layer, or the like, can be used as a mask. In this case, by making the energy for ion implantation higher than the energy for ion implantation that is to be given in formation of the above-mentioned p layer 13 by ion implantation, the electric field relaxation p-layer 16 can be formed deeper even in the case where the same acceptor specie is used. In addition, at this time, for the p layer 13 in the region just above the electric field relaxation p-layer 16, ion implantation is actually conducted two times, thereby the acceptor concentration thereof being made high as compared to that in the region where the electric field relaxation p-layer 16 is not formed, however, since the trench T is formed in a region separate from the electric field relaxation p-layer 16, and the channel is also formed in a region where there exists no electric field relaxation p-layer 16, the acceptor concentration of the p layer 13 being made non-uniform in this way will present no problem.

Figure 4C:
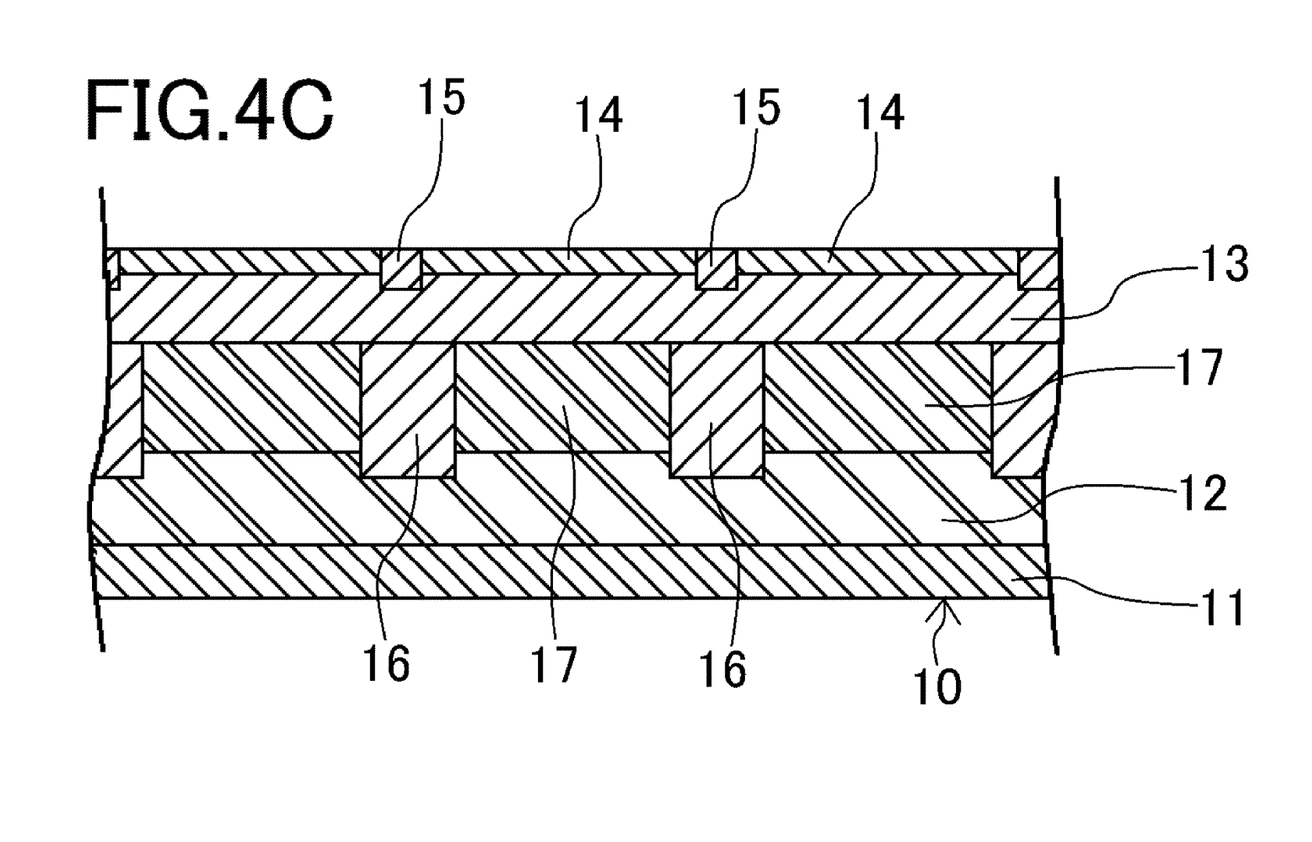
FIG. 4C is a process sectional view (a third of a set of figures) showing a part of the manufacturing processes for a semiconductor device according to the embodiment of the present invention.

Thereafter, as shown in FIG. 4C, by ion implantation, the n⁺ layer (the source region) 14 and the p⁺ layer 15 are formed on the uppermost surface of the semiconductor substrate 10. At this time, the ion implantation is conducted with low energy such that these are made sufficiently shallower than the p layer 13, or for the p⁺ layer 15, the ion implantation is conducted with an acceptor specie different from that used in formation of the p layer 13. As described above, in the case where the low resistance n-layer 17 and the p layer 13 are formed by ion implantation, heat treatment for activation is performed after this process.

Figure 4D:
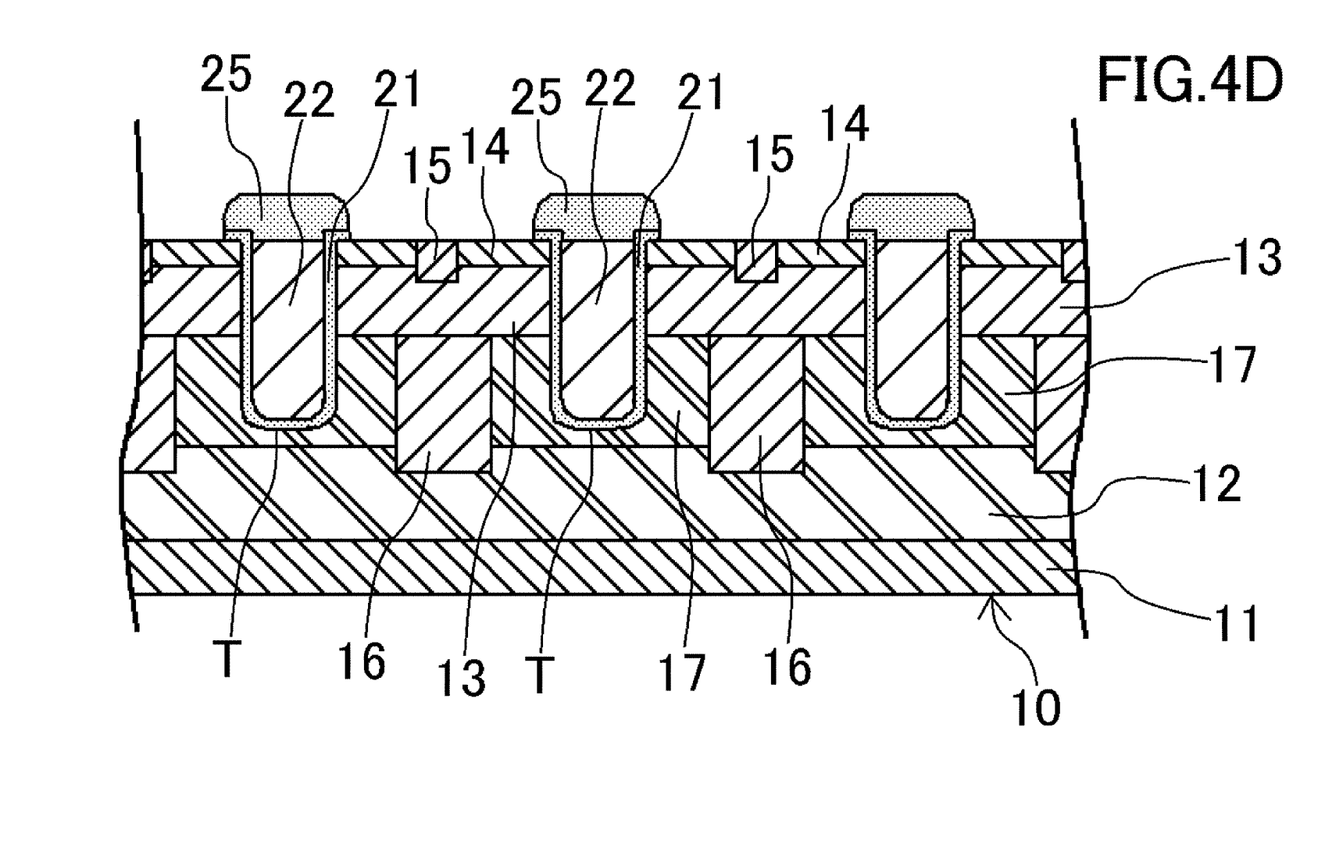
FIG. 4D is a process sectional view (a fourth of a set of figures) showing a part of the manufacturing processes for a semiconductor device according to the embodiment of the present invention.

Thereafter, by forming the trench T, which is followed by forming the gate oxide film 21 by thermal oxidation, then embedding the trench T with polycrystalline silicon, or the like, and then making etching-back, the gate electrode 22 is formed to provide a morphology in FIG. 4D. These processes are not different from those in manufacturing the conventional semiconductor device 200. This is true also for the processes for forming the interlayer insulating layer 25, the source electrode 23, and the drain electrode 24, which are performed thereafter for providing a morphology in FIG. 1.

In this way, the above-described semiconductor device 100 can be easily manufactured. In addition, with reference to FIG. 4A to FIG. 4D, the method of manufacturing the above-described semiconductor device 100 has been described, however, by changing the depth (the thickness) of the low resistance n-layer 17, or the depth of the trench T, the above-described semiconductor device 101 can be manufactured in the same manner.

Figure 5A:
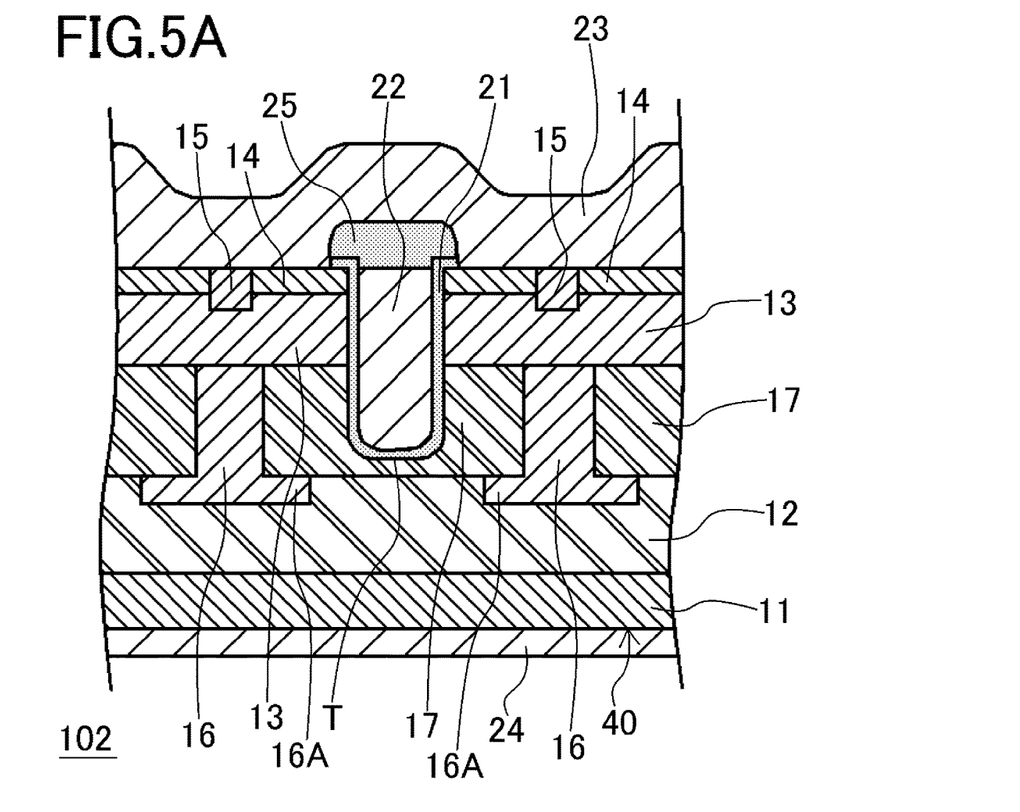
FIG. 5A is a sectional view (a first of a set of figures) of another variation of the semiconductor device according to the embodiment of the present invention.

In addition, FIG. 5A shows the structure of a semiconductor device 102, which is a variant of the above-described semiconductor device 100. With a semiconductor substrate 40 that is used in this structure, the width of the low resistance n-layer 17 in a horizontal direction is larger than the spacing thereunder between the electric field relaxation p-layers 16 on both sides thereof. Therefore, the bottom face of the electric field relaxation p-layer 16 has a protrusion part 16A that is protruded in a horizontal direction towards the trench T, the top face of the protrusion part 16A being in contact with the bottom face of the low resistance n-layer 17.

Figure 5B:
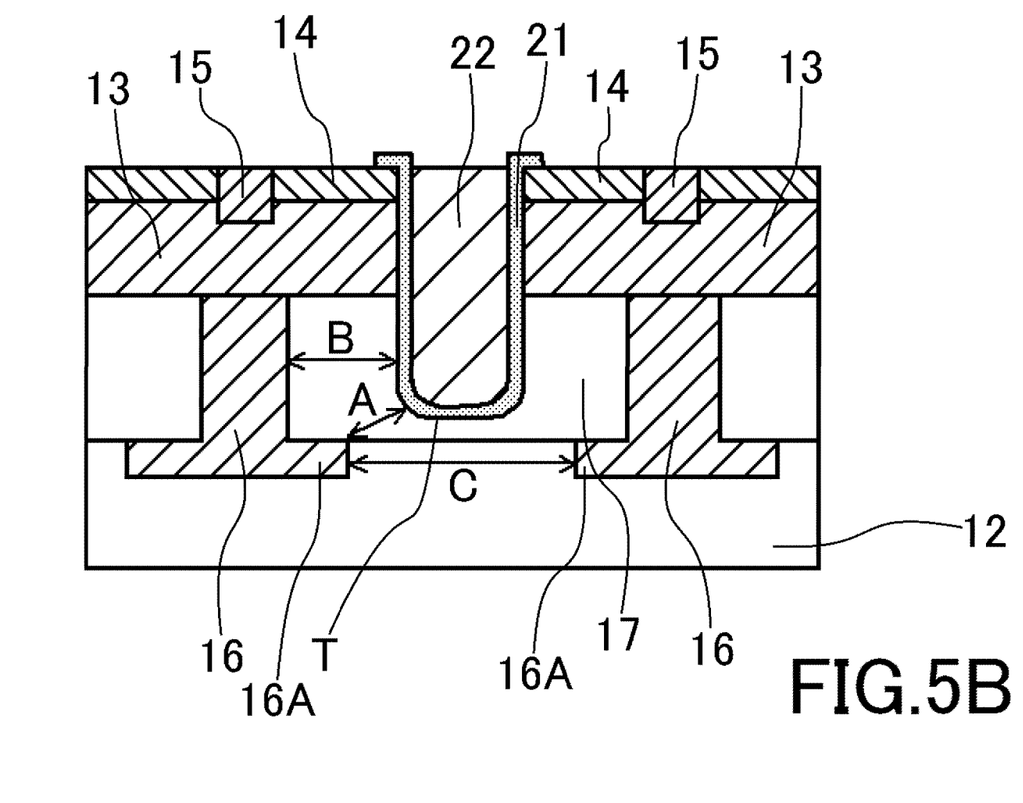
FIG. 5B is a sectional view (a second of a set of figures) of another variation of the semiconductor device according to the embodiment of the present invention.

FIG. 5B particularly shows the positional relationship among the electric field relaxation p-layer 16, the low resistance n-layer 17, and the trench T in the above-described structure. The effect of the electric field relaxation p-layer 16 that is exerted on the gate oxide film 21 in the bottom end part of the trench T becomes greater as the spacing between the bottom part of the electric field relaxation p-layer 16 and the bottom end part of the trench T is decreased. In other words, in order to increase such effect to thereby reduce the intensity of the electric field in the gate oxide film 21 in this portion, it is preferable to decrease the spacing A in FIG. 5B.

On the other hand, in order to reduce the resistance to the current in on state, it is preferable to increase the width of the low resistance n-layer 17 in a horizontal direction, in other words, increase the value of B in FIG. 5B. With the structure in FIG. 5B, the value of B can be increased, while the value of A is decreased. Thereby, the resistance in on state is reduced, while the intensity of the electric field within the gate oxide film 21 can be lowered. This structure can be manufactured by, for example, forming the low resistance n-layer 17 locally within the semiconductor substrate 40 by ion implantation such that the low resistance n-layer 17 is overlapped on the electric field relaxation p-layer 16. Alternatively, this structure can be manufactured by conducting ion implantation and epitaxial growth several times. In this case, by increasing the values of B and C, the resistance in on state can be reduced. On the other hand, with the value of C being increased, the value of A is also increased, and therefore, these values are set in consideration of the resistance in on state and the breakdown voltage.

For the above-described configuration, it has been assumed that the low resistance n-layer 17 is in contact with the p layer 13 on the top side, and the trench T and the electric field relaxation p-layer 16 on the lateral side. However, even in the case where the low resistance n-layer is not in contact with these, it is clear that, as compared to the case where the low resistance n-layer is not provided, the resistance in on state is low, due to the existence of the low resistance n-layer. In the case where the low resistance n-layer is formed by ion implantation, the depth and location thereof can be particularly easily adjusted, such a morphology can be provided. This is also true, even in the case where, in the configuration in FIG. 5A, the top face of the protrusion part 16A of the electric field relaxation p-layer 16 is not in contact with the bottom face of the low resistance n-layer 17, and the n⁻ layer 12 is interposed between these.

In the above example, there has been a description about the case where SiC, with which the intensity of the electric field within the gate oxide film 21 in the trench T can have a particularly significant effect on the breakdown voltage in off state, is used, however, even in the case where the semiconductor substrate is formed of any other material, it is clear that the above configuration is also effective for a trench gate type element.

In addition, in the above example, the statement has been made about the power MOSFET of n-channel type, it is also possible to adopt the same configuration for the p-channel type. In this case, by using a first semiconductor layer, a second semiconductor layer, an electric field relaxation layer, a low resistance layer, and the like, with which the conductivity type has all been reversed to that of the above-mentioned ones, the same effect can be obtained.

Reference numeral 100, 101, 102, 200 denotes a semiconductor device (a power MOSFET); 10, 30, 40, 50 a semiconductor substrate; 11 an n⁺ layer (a drain layer); 12 an n⁻ layer (a drift layer: a first semiconductor region); 13 a p layer (a body layer: a second semiconductor region); 14 an n⁺ layer (a source region: a third semiconductor region); 15 a p⁺ layer; 16 an electric field relaxation p-layer (a fourth semiconductor region); 16A a protrusion part; 17 a low resistance n-layer (a fifth semiconductor region); 21 a gate oxide film; 22 a gate electrode (a control electrode); 23 a source electrode (a first main electrode); 24 a drain electrode (a second main electrode); 25 an interlayer insulating layer; and T a trench.

What is claimed is:

1. A semiconductor device, comprising:
   a first semiconductor region of a first conductivity type,
   a second semiconductor region of a second conductivity type opposite to the first conductivity type that has been formed above the first semiconductor region,
   a third semiconductor region of the first conductivity type that has been formed on the second semiconductor region,
   two or more trenches, each of these is formed from a surface of the third semiconductor region to a depth penetrating through the third semiconductor region and the second semiconductor region,
   a control electrode that has been formed in each of the trenches,
   a fourth semiconductor region of the second conductivity type that is in contact with the second semiconductor region between the trenches that are adjacent to each other, and is formed deeper than the trenches, being separated from the trenches,
   a source electrode that is electrically connected to the second semiconductor region and the third semiconductor region,
   a drain electrode that is electrically connected to the first semiconductor region, and
   a fifth semiconductor region of the first conductivity type that is between the first semiconductor region and the second semiconductor region, being formed between the trenches and the fourth semiconductor region, and being provided with a carrier concentration higher than that of the first semiconductor region,
   wherein a bottom part of the fourth semiconductor region has a protrusion part that is protruded towards the trenches in a horizontal direction.

2. The semiconductor device according to claim 1, wherein a top face of the protrusion part is in contact with a bottom part of the fifth semiconductor region.

* * * * *

UNITED STATES PATENT AND TRADEMARK OFFICE
CERTIFICATE OF CORRECTION

PATENT NO. : 9,698,217 B1
APPLICATION NO. : 15/188513
DATED : July 4, 2017
INVENTOR(S) : Ryohei Baba et al.

Page 1 of 1

It is certified that error appears in the above-identified patent and that said Letters Patent is hereby corrected as shown below:

On the Title Page

Item (73), after Assignee delete "KYOCERA Document Solutions Inc., Osaka (JP)"

Signed and Sealed this
Twenty-eighth Day of August, 2018

Andrei Iancu
*Director of the United States Patent and Trademark Office*